US006953047B2

(12) United States Patent
Birtcher et al.

(10) Patent No.: US 6,953,047 B2
(45) Date of Patent: Oct. 11, 2005

(54) CABINET FOR CHEMICAL DELIVERY WITH SOLVENT PURGING

(75) Inventors: Charles Michael Birtcher, Valley Center, CA (US); Martin Castaneda Martinez, Oceanside, CA (US); Thomas Andrew Steidl, Escondido, CA (US); Gil Vivanco, San Diego, CA (US); David James Silva, San Diego, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 322 days.

(21) Appl. No.: 10/046,614

(22) Filed: Jan. 14, 2002

(65) Prior Publication Data

US 2003/0131885 A1 Jul. 17, 2003

(51) Int. Cl.[7] ............................ B08B 5/00; B08B 9/02; B08B 9/032

(52) U.S. Cl. ......................... 137/240; 134/1.2; 134/1.3; 134/22.14; 134/22.19; 134/102.2; 134/166 C; 134/171; 137/15.04; 137/15.05; 137/883; 137/885; 251/31; 251/61.1

(58) Field of Search ........................... 137/15.04, 15.05, 137/112, 113, 209, 240, 883, 885; 134/1.2, 1.3, 22.14, 22.19, 37, 94.1, 95.1, 98.1, 99.2, 102.2, 166 C, 171; 141/1, 47, 49, 63, 104; 222/148, 152; 251/31, 61.1

(56) References Cited

U.S. PATENT DOCUMENTS

| | | | | |
|---|---|---|---|---|
| 3,958,720 | A | | 5/1976 | Anderson .................... 221/93 |
| 4,357,175 | A | | 11/1982 | Buffington et al. ........... 134/10 |
| 4,537,660 | A | | 8/1985 | McCord ..................... 202/170 |
| 4,570,799 | A | | 2/1986 | Mednis ....................... 206/509 |
| 4,832,753 | A | | 5/1989 | Cherry et al. ............ 134/22.18 |
| 4,865,061 | A | | 9/1989 | Fowler et al. ............. 134/108 |
| 4,871,416 | A | | 10/1989 | Fukuda |
| 5,045,117 | A | | 9/1991 | Witherell ..................... 134/21 |
| 5,051,135 | A | | 9/1991 | Tanaka et al. ................ 134/10 |
| 5,106,404 | A | | 4/1992 | Grant ......................... 55/195 |
| 5,108,582 | A | | 4/1992 | Foutsitzis et al. ........... 208/138 |
| 5,115,576 | A | | 5/1992 | Roberson et al. .............. 34/15 |
| 5,240,507 | A | | 8/1993 | Gray et al. ................... 134/21 |
| 5,297,767 | A | | 3/1994 | Miller et al. ............. 248/311.2 |
| 5,304,253 | A | | 4/1994 | Grant ......................... 134/26 |
| 5,339,844 | A | | 8/1994 | Stanford, Jr. et al. ....... 134/107 |
| 5,398,846 | A | | 3/1995 | Corba et al. ................... 222/1 |
| 5,409,141 | A | | 4/1995 | Kikuchi et al. ............... 222/81 |
| 5,425,183 | A | | 6/1995 | Taylor et al. .................. 34/73 |
| 5,469,876 | A | | 11/1995 | Gray et al. ................. 134/105 |
| 5,472,119 | A | | 12/1995 | Park et al. ............... 222/145.8 |
| 5,479,959 | A | * | 1/1996 | Stotelmyer et al. ......... 137/559 |
| 5,509,431 | A | | 4/1996 | Smith, Jr. et al. .......... 134/95.1 |

(Continued)

FOREIGN PATENT DOCUMENTS

| | | | |
|---|---|---|---|
| EP | 1 031 533 A1 | 8/2000 | |
| JP | 8115886 | 5/1996 | ......... H01L/21/205 |
| WO | 9964780 | 12/1999 | ........... F17C/13/00 |
| WO | WO 00/00767 | 1/2000 | |

*Primary Examiner*—George L. Walton
(74) *Attorney, Agent, or Firm*—Geoffrey L. Chase

(57) ABSTRACT

The present invention is an apparatus for storing and delivering a low vapor pressure process chemical to a process tool for semiconductor fabrication, comprising: a) a bulk container for storing the process chemical; b) a process container for delivering the process chemical to the process tool; c) a first manifold for delivering process chemical from the bulk container to the process container; d) a solvent container containing a quantity of solvent, and; e) a second manifold for delivering the process chemical from the process container to a process tool. A process for using the apparatus is also contemplated.

21 Claims, 3 Drawing Sheets

U.S. PATENT DOCUMENTS

| | | | | | |
|---|---|---|---|---|---|
| 5,538,025 | A | | 7/1996 | Gray et al. | 134/105 |
| 5,551,309 | A | * | 9/1996 | Goossens et al. | 137/113 |
| 5,557,381 | A | | 9/1996 | Sakamoto et al. | 355/260 |
| 5,562,883 | A | | 10/1996 | Salisbury et al. | 422/133 |
| 5,565,070 | A | | 10/1996 | Doi et al. | 203/91 |
| 5,573,132 | A | | 11/1996 | Kanfer et al. | 220/4.23 |
| 5,657,786 | A | * | 8/1997 | DuRoss et al. | 137/240 |
| 5,711,354 | A | * | 1/1998 | Siegele et al. | 141/198 |
| 5,964,230 | A | | 10/1999 | Voloshin et al. | 134/98.1 |
| 6,029,717 | A | * | 2/2000 | Siegele et al. | 141/198 |
| 6,138,691 | A | | 10/2000 | Voloshin et al. | 134/22.11 |
| 6,170,703 | B1 | | 1/2001 | Butler et al. | |
| 6,199,599 | B1 | * | 3/2001 | Gregg et al. | 141/1 |
| 6,264,064 | B1 | * | 7/2001 | Birtcher et al. | 222/1 |
| 6,296,025 | B1 | | 10/2001 | Gregg et al. | |
| 6,296,026 | B1 | * | 10/2001 | Gregg et al. | 141/1 |
| 6,431,229 | B1 | * | 8/2002 | Birtcher et al. | 141/302 |
| 6,457,494 | B1 | * | 10/2002 | Gregg et al. | 137/240 |

* cited by examiner

CABINET FOR CHEMICAL DELIVERY WITH SOLVENT PURGING

BACKGROUND OF THE INVENTION

The Present Invention is directed to the field of process chemical delivery in the electronics industry and other applications requiring high purity chemical delivery. More specifically, the present invention is directed to apparatus and processes for the cleaning of process chemical delivery lines, containers and associated apparatus, particularly during changeout of process chemical or process chemical containers in such process chemical delivery lines.

Evacuation and gas purge of process chemical lines has been used to remove residual chemicals from delivery lines. Both vacuum draw and inert gas purge are successful in quickly removing high volatility chemicals, but are not effective with low volatility chemicals. Safety is a problem when extracting highly toxic materials.

Use of solvents to remove residual chemicals is not new. Various patents have sought to clean systems using solvents, which are hereby specifically incorporated by reference in their entirety herein:

U.S. Pat. No. 5,045,117 describes a method and apparatus for cleaning printed wiring assemblies with a solvent and vacuum action.

U.S. Pat. No. 5,115,576 discloses an apparatus and method of cleaning semiconductor wafers using isopropyl alcohol solvent.

Additional patents regarding solvent cleaning include; U.S. Pat. No. 4,357,175, U.S. Pat. No. 4,832,753, U.S. Pat. No. 4,865,061, U.S. Pat. No. 4,871,416, U.S. Pat. No. 5,051,135, U.S. Pat. No. 5,106,404, U.S. Pat. No. 5,108,582, U.S. Pat. No. 5,240,507, U.S. Pat. No. 5,304,253, U.S. Pat. No. 5,339,844, U.S. Pat. No. 5,425,183, U.S. Pat. No. 5,469,876, U.S. Pat. No. 5,509,431, U.S. Pat. No. 5,538,025, U.S. Pat. No. 5,562,883 and Japanese 8-115886.

Various other prior art US Patents are in the same technical field as the Present Invention and are specifically incorporated by reference herein in their entirety:

- U.S. Pat. No. 5,472,119—Dec. 5, 1995—Assembly for dispensing fluids from multiple containers;
- U.S. Pat. No. 5,398,846—Mar. 21, 1995—Assembly for simultaneous dispensing of multiple fluids;
- U.S. Pat. No. 5,297,767—Mar. 29, 1994—Multiple Container Holder;
- U.S. Pat. No. 4,570,799—Feb. 18, 1986—Multiple Container Package;
- U.S. Pat. No. 3,958,720—May 25, 1976—Adjustable Multiple container dispensing apparatus;
- U.S. Pat. No. 5,557,381—Sep. 17, 1996—Develop supplying unit with multiple containers;
- U.S. Pat. No. 5,573,132—Nov. 12, 1996—Dispensing Container;
- U.S. Pat. No. 5,409,141—Apr. 25, 1995—Two component mixing and delivery system;
- U.S. Pat. No. 5,565,070—Oct. 15, 1996—Solvent vapor sucking method and solvent recovering apparatus;
- U.S. Pat. No. 4,537,660—Aug. 27, 1985—Vapor generating and recovering apparatus; and
- U.S. Pat. No. 5,051,135—Sep. 24, 1991—Cleaning method using a solvent while preventing discharge of solvent vapors to the environment.
- U.S. Pat. Nos. 5,964,230 and 6,138,691 both describe a solvent purge technology that uses a special coaxial device to administer solvent to the deadspace above a container of process chemical.

- WO 99/64780 describes a solvent purged chemical delivery system which uses three separate sources of purge, including solvent, gases, and hard and Venturi vacuum.

Current systems involving solvent purging of internal plumbing lines are designed to solvent purge extensive portions of the flow lines requiring significant amounts of solvent. In addition, the design of the valves in such systems are not configured to minimize the geometries to be cleaned. These prior art systems require large solvent volumes, excessive cleaning times and complex operations. The present invention, as set forth below, overcomes these difficulties and drawbacks of the prior art by minimizing the flow lines that require solvent purging, providing valve geometries which minimize deadspace and convoluted flow paths, while providing automatic operation with self contained solvent supply and recovery.

BRIEF SUMMARY OF THE INVENTION

The present invention is an apparatus for storing and delivering a low vapor pressure process chemical to a process tool for semiconductor fabrication, comprising:

a) a bulk container for storing the low vapor pressure process chemical;

b) a process container for delivering the low vapor pressure process chemical to the process tool;

c) a first manifold for resupplying the low vapor pressure process chemical from the bulk container to the process container through one or more diaphragm valves having the valve seat side of the valve directed to the portion of the manifold which can be disconnected from the bulk container;

d) a solvent container containing a quantity of solvent for the low vapor pressure process chemical and connected in fluid flow with the first manifold;

e) a second manifold for delivering the low vapor pressure process chemical from the process container to the process tool through one or more diaphragm valves having the valve seat side of the valve directed to the portion of the manifold which can be disconnected from the first manifold;

f) a source of vacuum;

g) a source of pressurized inert gas;

h) a controller for controlling the flow of process chemical from the bulk container and from the process container and the flow of solvent from the solvent container and for cycling the first and second manifolds through a cleaning cycle of a series of applications of vacuum, pressurizing gas and solvent to clean the manifolds.

The present invention is also a process of storing and delivering a low vapor pressure process chemical to a process tool for semiconductor fabrication, comprising:

a) providing a quantity of the low vapor pressure process chemical in a bulk container;

b) periodically delivering the low vapor pressure process chemical to a process container from the bulk container through a first manifold having one or more diaphragm valves having the valve seat side of the valve directed to the portion of the manifold that can be disconnected from the bulk container;

c) periodically delivering the low vapor pressure process chemical to a process tool from the process container through a second manifold having one or more diaphragm valves having the valve seat side of the valve directed to the portion of the manifold that can be disconnected from the process container;

d) providing a quantity of solvent for the low vapor pressure process chemical in a solvent container;

e) periodically delivering the solvent to the first or second manifold when the low vapor pressure process chemical is not being delivered to the first or second manifold to remove the low vapor pressure process chemical from the manifold and storing it in a solvent recovery container.

The present invention can also be used to deliver solvent to the process tool and to house process chemical lines.

DETAILED DESCRIPTION OF THE INVENTION

Figure 1:
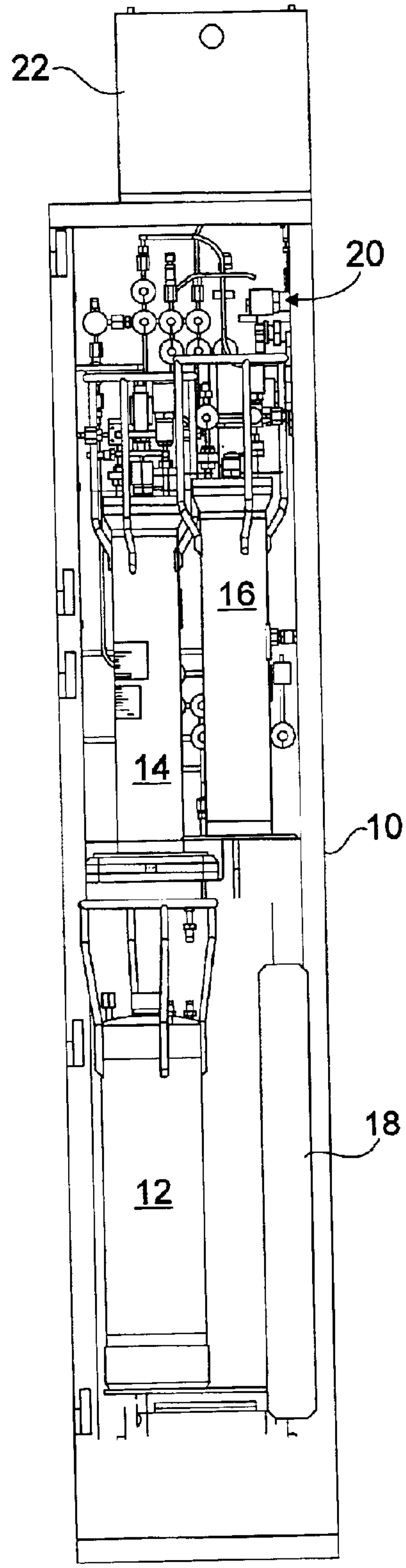
FIG. 1 is a plan view of a cabinet arranged in accordance with the present invention.

The present invention is designed to provide one or more liquid chemical precursors to a process tool designed for manufacturing semiconductors, and to allow said precursors to be easily and efficiently cleaned from key areas of piping to permit rapid replacement of process reservoirs, ampoules, degassers, valves and other associated components in the delivery system. These replacements may be required as a result of regular preventive maintenance routines, or they may be required due to a particular component failure or other need to modify or upgrade the system. The apparatus consists of a cabinet for the storage of bulk containers of chemicals, which can range from 1 liter to over 200 liters, depending on the applications. This cabinet may contain one or a plurality of reservoirs connected together through several means.

In one embodiment, the vessels may be used to feed from one vessel to the next in a daisy chain fashion. In another embodiment the vessels may be hooked up in parallel such that one provides a backup to the other. In another embodiment, there may only be one reservoir in the cabinet, with additional ampoules or additional intermediate storage cabinets and systems interspersed between the refill system and the process tool that uses the chemical. The lines connecting the refill systems to the process tools or storage reservoirs would be connected by manifolds that are designed themselves to be solvent purged.

The refill system would contain either integrally to the cabinet, or externally in a separate cabinet, a series of piping manifolds and reservoirs that supply solvent appropriate to the chemical precursor in use, as well as collection reservoirs for the capture of the spent solvent for future disposal. The solvent reservoir may be of nearly any size from a few hundred milliliters in volume to over 200 liters, while the capture vessel needs to be sized to permit capture of the solvent used in any one operation. An operation can be defined as replacement of the precursor tank, with a consequent small volume of chemical required just to clean out the fittings, to the cleaning of an entire distribution manifold, with a consequent volume that could range in the liters or more depending on the lengths of the lines and the number of distribution points.

The overall intent of the system is to constant and stable outlet pressure and a constant flow of precursor chemical without downtime or interruption in supply associated with reservoir replacement. The use of the solvent purging reduces the time for chemical changeout from a matter of days/hours to a matter of hours/minutes, respectively, greatly improving uptime capabilities, and reducing the labor time required to effect the replacement.

The biggest advantage in the use of solvent purging comes from the ability to extract residues of very low volatility materials, such as tetradimethylaminotitanium (TDMAT), tetradiethylaminotitanium (TDEAT), tantalum pentaethoxide (TAETO), $TiCl_4$, copper perfluoroacetylacetonate-trimethylvinylsilane and associated metallorganic copper, titanium, or tantalum compounds. Other materials, such as barium, strontium, titanate mixtures (BST) and PZLT precursors, as well as low-k dielectric precursors are also specified and are compatible with this type of process. However, rapid and efficient removal of higher volatility materials such as tetraethylorthosilicate (TEOS), trimethylphosphite (TMPI), trimethylphosphate (TMPO), trimethylborate (TMB), triethylborate (TEB), tetramethylcyclotetrasiloxane (TOMCATS), and other silicon and silicon dioxide precursors as well as their dopants also is feasible.

Some key factors one would use to select solvent purging over other techniques would include: precursors that are oxygen or moisture sensitive; precursors that are extremely toxic and must be removed with certainty below specified exposure limits; low volatility precursors that cannot be removed by room temperature vacuum purges; precursors who have freezing points high enough that evaporative cooling from vacuum purges causes them to freeze; high viscosity precursors that stick to tubing or that form pools that are irremovable using other techniques; highly flammable or pyrophoric precursors that must be completely removed before exposure of the piping to air.

The solvents that may be used in such a system are selected from groups of materials that are compatible with the precursor materials. These would include hydrocarbon solvents, such as pentane, hexane, heptane, octane and nonane; alcohols such as ethanol, methanol, isopropanol; perfluorocarbons, such as perfluorohexane and perfluoroheptane, et al; mineral spirits and other polar and non-polar solvents that are discerned as suitable for the chemistry. The use of liquid $CO_2$ as a supercritical cleaner can easily e incorporated into this system, as well as the use of $CO_2$ snow. The selection of solvents will generally require high purity solvents (>98%, but preferably >99.9%), that are generally anhydrous and oxygen free. The molecules of the solvent may include oxygen, if the bonds are sufficiently high that there is no potential for oxidation of the precursor, but an oxygen free molecule is generally preferred. If required, mixtures of solvents and/or isomers of solvents are acceptable and may in some cases be required for certain precursor and precursor families.

The best possible solvent would incorporate the following features:

1—High solubility of precursor in solvent with no inherent stratification

2—Rapid dissolving of precursor into solvent

3—Non-toxic per EPA rules, meaning:
  - nonflammable
  - nontoxic
  - nonreactive
  - noncorrosive
  - not on the list of disapproved solvents 4—No environmental side-effects such as high global warming potential, or high ozone depletion capability.

5—Evaporates rapidly under vacuum

6—Low surface adsorption on piping surfaces

7—Low cost

8—High purity

9—No reactivity with precursors

The materials of construction of such a refill system is mostly dependant upon the precursor in question. The materials must be chemically compatible to prevent corrosion or reaction with the precursor or solvent, strong enough to support the pressures and vacuum forces used, generally leak tight to hold vacuum from 1 mTorr to 500 mTorr depending on the compounds in use.

Materials of construction may include, but are not restricted to:

A—Metals such as electropolished or non-electropolished stainless steel, copper, Hasteloy, Elgiloy, nickel, polysilion, titanium and other metals or alloys compatible with semiconductor precursors and solvents;

B—Plastics, such as polytetrafluoroethylene (PTFE) or PFA or other formulations of Teflon, polyethylene, polypropylene, HDPE, and other materials compatible with semiconductor precursors or solvents; sealing materials, such as Ves Pel brand, KyNar brand, Kalrez brand, Chemrez brand and Vitar brand sealants, polymers and elastomers;

C—Ceramic materials or glasses, such as fused quartz, borosilicate glass, pure glass, boron nitride, silicon carbide, and related ceramic or glass materials D—Lined or composite materials, such as carbon fiber or Teflon lined components, carbon fiber/resin materials; and other similar materials that are compatible with high purity precursors and solvents.

Valves are used in the refill system in these refill systems and are extensively discussed below. Note that while there are technical differences in the operation of each valve, generally there are two main types of valves used in these applications: manual and automatic.

Manual valves have a handle that allows a person to open by turning or lifting a handle. The sequencing of manual valves can be completely controlled by the operator reading a sequence, or through prompting from a control system. Manual valves are sometimes used on shippable vessels in order to ensure maximum safety during the shipping process.

Automatic valves generally consist of the same wetted components of manual valves, but have actuators that can be controlled by a computer or other electronic controller or sequencer. The means of actuation can include: electric; pneumatic or hydraulic requiring electrically operated pilot valves to direct the fluid—air or liquid—into the actuator; servo-driven, or stepper motor driven. Other techniques are available and are equivalent and well documented in the literature. MEM (Micro-electronic mechanical) valve devices can also be used to perform these same functions.

A key discussion below will center on the orientation or the valves as compared to the valve seats, and also in the number of actuators installed in the valve.

The refill system generally consists of a cabinet, into which is placed one or a plurality of precursor reservoirs. These reservoirs can be connected together to a process tool through a series of piping manifolds, consisting of pipes and fittings, valves, check valves, pressure detection and control devices, localized distribution manifolds, degassers, ampoules and other intermediate storage tanks. These are typically controlled by electronic controllers, that monitor and sequence the valves in particular sequences depending on their function required. This in general is well described in the literature, with refill system designs for use in semiconductor fabrication applications.

The cabinet consists of an enclosure, in this embodiment made of steel, which contains the other components. The cabinet may be made of aluminum or any other material suitable for an industrial environment. It is mechanically sound enough to support the weight of the chemical vessels, manifolds and other equipment installed. In our embodiment, the main replaceable reservoir resides in the bottom section of the cabinet to facilitate the removal of the chemical precursor "bulk" tank. A secondary "process" tank resides on a platform elevated above the primary tank. Note that a more horizontal configuration is available and has been presented in prior art. The placement of one tank above the other is chosen to minimize the floor space requirements of the system.

For larger refill systems feeding 100–200 liters of chemical, the use of a much larger cabinet is required. In these cases, the secondary reservoirs are either not elevated above the level of the first containers and are therefore placed at a similar elevation in the cabinet, or a secondary cabinet is used to facilitate bulk transfers.

The cabinet needs to be exhausted to a scrubber system—usually built into the factory facility—to prevent the unwanted escape of fumes in the event of a spill or leak of process chemical or solvent, and also contains secondary containment capable of capturing the contents of the chemical vessels in the event of a major spill. Exhaust flow and/or exhaust pressure are monitored to ensure that it remains active at all times.

The walls of the cabinet are designed to limit the impact of a fire either inside or outside of the cabinet. Fire detecting and extinguishing media can be installed in the cabinet. The cabinet should also be sound enough to be able to withstand strong earthquakes when bolted to a suitable structure. Our cabinet contains interfaces to permit the installation of earthquake bolt-down points, fire extinguishers, and facility exhaust systems.

Electronics to drive the system can be constructed within the main cabinet, or may be placed in a separate enclosure and connected to the main system components through cables and tubing as required for a specific setup. In our embodiment, the electronics enclosure is placed on top of the main cabinet and connected through feedthroughs into the main cabinet. In previous systems, we have also placed the electronics into a chemically isolated region of the main cabinet.

The electronics control system generally consists of a micro-controller, a microprocessor, a PLC (programmable Logic Controller) or another type of computer that carries on the functions of sequencing the system, monitoring alarms, communicating to other refill modules and the main processing tool. This communication can take place using "Direct digital control", that generally takes the form of a series of input and output relays, optically isolated to prevent stray interference from causing problems. This communication may also take place using a serial interface such as an RS-232 link, IEEE 485, Modbus, DeviceNet, or using a computer network interface, such as Ethernet, or wireless protocols.

The operator interface consists optionally, depending on end-user needs, a display screen with associated keypad that is used to operate functions, initiate actions, monitor status and provide historical data on such events as alarms. Another option is a touchscreen interface, which may be full color or monochrome, that provides similar functions but is more intuitive, even if more expensive. The touchscreen display also has the ability to show the operator "maps" of the system, including system operations on local and remote modules, alarm status anywhere on the network, and other related tasks as called upon in software. The local operator interface can make use of voice and audible status indicators, as well as accept voice commands to initiate processes. A remove operator interface or Human-Machine-Interface may also be installed.

The electronics area can be purged with inert gas, the "Z-purge" as required by National Fire Protection Association (NFPA) standards. This requires an inlet line carrying nitrogen or other inert gas into the electronics box or area at a pressure exceeding 0.1 inches of water column (as specified in NFPA codes). When Z-purged, the electronics enclosure itself must be sealed well enough to maintain this internal pressure in order to prevent any flammable precursor fumes from entering the enclosure. Finally, the enclosure may be monitored, either using a pressure switch or other gauge to ensure that the pressure inside the electronics does not deviate below the minimum pressure. This pressure monitoring device is interlocked with the overall system power to provide alarms and/or a shut down of the system in the event of an inert gas pressure failure.

We also have provisions for setting a small vacuum pump, a cabinet temperature control system and other equipment in a pre-defined expansion space on the top of the cabinet, again to minimize footprint.

The cabinet will have doors for access, which are preferably connected to latches and interlocks to prevent unauthorized entry. There may be one or a plurality of doors on the system. In one embodiment of our invention, the doors are placed one above the other, and interconnected in such a way that only the main lower door can be opened without tools, and a key or tool required to open the upper door. The upper door should only be required to be opened in the event of significant maintenance events. The upper door also serves to control the amount and locations of exhaust within the cabinet, and to maximize the safety in the event that an error occurs during reservoir replacement. The door interlocks provide a mechanism by which an operator or a central control network can identify that the doors have been opened. These interlocks are optionally selectable to provide functions, such as alarms, EMO stops, and life safety alarms to the system, if required by local jurisdictions, or desired by an end-user operator.

In our invention, the cabinet as a whole may be heated to prevent materials that have freezing points near room temperature from becoming solid or becoming slushy. This heater is placed on the door of the cabinet, with a suitable NFPA/OSHA approved cabling setup to ensure that no spark sources are present. The location of the heater on the door provides benefits: permits the installation of the heater as an option without affecting the ability of the system to be located against walls or against one another; permits the use of exhaust flow to draw in air for heating without adversely affecting the airflow dynamics in the cabinet; allows for easy field installation of the heating unit in the field if required, simply by replacing the door assembly; allows heating and thermal control without the addition of moving parts such as fans. In order to ensure complete and relatively uniform heating, the walls of the cabinet are lined with insulation that may be a self adhesive foam having a fireproof and suitable R-factor characteristics. Thermal sensing is performed at one or a plurality of points in the cabinet, one of the most important of which is the final distribution manifold, as it is the location farthest from the heat source, and closest to the exhaust. It will therefore run the coolest. The heat source may also be generated through conduction such as conducting heater plates or heat jackets and heat tape.

A variation on this theme is to heat the plumbing pieces directly using wrap around heaters and insulation. While this provides some benefit in improved temperature control, the increased cost may make it unattractive to others. The selection of heating and temperature control method is dependent mostly on the specific application and the thermal budget of the process itself. This type of heating is sometimes required to provide supplemental heating to the outlet manifold.

The cabinet as designed includes piping and exhaust that exits from the top of the cabinet, allowing the cabinets to be placed directly side-by-side and to be butted up against walls, again to minimize floor space The liquid chemical precursor is supplied in bulk reservoirs. These range in size from a few liters up to over 200 liters. The material of construction of the vessels is typically stainless steel, but may be made from other materials depending on the reactivity of the precursor with the material in question. The reservoirs are designed to meet the utmost in purity standards, so that precursors such as TEOS, TDMAT, TDEAT, TAETO and others can be delivered with 99.999% or better purity, with metallic impurities ranging below 1 to 10 ppb. All the materials listed above may be considered for reservoir materials. The reservoirs also contain one or a plurality of valves and ports and sensors, as described below to allow access to that high purity chemical.

Each reservoir contains a level sense system, which may be disposed within the reservoir, as is the case with our ultrasonic level sense, as well as the more primitive float probes. Other level sense techniques include thermally based level sense, differential pressure, both discrete and continuous ultrasonic level sense, capacitive, optical and microwave impulse radar level senses. Most internal level sense systems have the disadvantage of requiring an extra container penetration, and in the case of float probes, include moving parts which have been shown to add particulate to otherwise highly purified precursor chemicals.

The level sense may also be disposed outside of the reservoir. These level sense types include ultrasonic, scales/load cells, thermal, X-ray/radiation, and similar techniques. These techniques have the advantage of having no penetration into the reservoir interior, even though the accuracy of the measurement may not be quite as controllable.

Ultrasonic empty sensing can be done using a clamp-on ultrasonic sensor attached to the liquid delivery line, permitting the refill system to precisely gauge when no more chemical is left in the replaceable bulk tank, allowing the end-user customer to consume all of the very expensive precursors.

Each reservoir also contains a means for moving the chemical out of its interior. This may be comprised of a dip tube, usually made of an inert material such as stainless steel, but also other metals such as copper for copper precursors, titanium, nickel, Elgiloy, Hasteloy and other similar materials, non-metallic materials such as silicon carbide, boron nitride, glass, fused quartz, and so on; or even plastics such as PTFE or PFA Teflon, HDPE polypropylene and other related materials. The most common type, in use since the late 1980s, incorporates a fixed dip tube welded onto the interior surface of the reservoir, or to an extension piece penetrating the reservoir wall and in both cases, extending to a tube that is connected to an outlet valve. This outlet valve then controls the flow of the precursor chemical to the rest of the system, and may be manual or automatic in operation, as described earlier.

A variation on this principle is the removable dip tube, which mounts to the reservoir though a connection such as a VCR or UPG fitting to seal it against leaks and to permit it's easy removal for cleaning and repair. Typically, a removable diptube will be inserted through a sleeve that is welded to the outside of the vessel, with the fitting also mounted on the sleeve. The diptube contains the appropriate fitting to mate to the sleeve.

In both cases, the diptube must end at a point below the lowest level sense point to prevent waste of valuable process precursor. This length was established in the mid-1980s and has continued to remain the most popular length of a diptube. In most reservoir designs, the bottom of the reservoir is shaped to facilitate the flow of chemical to the lowest point in the reservoir, either through the installation of a well, the use of a hemispherical base, or an assymetric bottom arrangement, mostly dependent upon the designed location of the diptube.

A diptube is not required in all cases, as in some containers a bottom feed port may be introduced to permit the complete removal of all chemical from a well at the bottom of the reservoir. This bottom feed port consists of a penetration into the interior of the reservoir, a small tube welded or secured in place with a suitable fitting and a valve (either manual or automatic) used to control the flow of the liquid from the tank. This configuration also permits easier cleaning of the interior of the reservoir, by removing the surfaces of the diptube normally wetted by precursor. This is especially important when considering water reactive precursors, as moisture adhering to the diptube can result in particulate generation and chemical contamination.

The reservoirs also contain a separate penetration for inert gas to flow into the reservoir. In most refill systems of this classification, the chemical flows, at least initially, due to differential pressure between the inlet side of the reservoir and the pressure at the outlet of the reservoir. After that, pumps or other means may occasionally be used to deliver the chemical to where it is needed. This penetration usually takes the form of a small tube welded to the top of the container, which is then attached to a valve (either manual or automatic) that controls the influx of the inert gas into the reservoir. The flow direction of the inert gas line penetration is not defined, and can be used for multiple functions, for example, venting of excess pressure from the interior of the vessel, or refilling from a separate vessel, although frequently a third port is added for that function. The inert gas line may be attached to a baffle in the interior of the reservoir, which is used to prevent the splattering of process chemical into the inert gas delivery system or into the vent system during a venting operation. Such a baffle can consist of right angled tubing, a "tee" fitting, a screen/mesh assembly, or a filter, including metal, ceramic or plastic filters all available on the open market. Typically, the space above the liquid level is called the headspace, so this port is usually called a headspace port.

Many reservoirs also contain a third port, usually designed without a diptube, that permits the filling of the reservoir from an external source without interrupting the functions of the other two ports. In other words, using this third port, with suitable piping can permit the filling of the reservoir while chemical is being simultaneously withdrawn for use in a downstream application, saving downtime. It also contains a valve on a pipe extending from the top of the reservoir. In most cases, no diptube is installed to facilitate the purging of the line with inert gas, however, in some designs going back to the late 1980s, there is a diptube on these ports also to permit the removal of all of the liquid precursor from the reservoir back into an original source reservoir or to some other location. Note that reservoirs having this third penetration can also use this port for overpressure relief, and this is a common feature. In some cases, the port has a "check-valve" style pressure relief valve on it. These are considered to be reusable devices, as they release pressure and snap back shut. In some cases, a one time use burst disk device may be used, although this has the disadvantage of allowing atmospheric gases back into the vessel after the pressure has been relieved and is certainly not the device of choice with any sort of air-reactive precursor. Note that some reservoirs have their pressure relief ports set apart from the other three ports, allowing a fourth penetration on the vessel.

Note that for different applications, the relative location of the diptube and headspace ports may alternate. In the event of a direct liquid injection (DLI) process, or for transfilling liquid chemical from one reservoir to another, the inert gas is fed into the headspace of the container and the liquid removed via the diptube. However, for applications that use diluted chemical vapors and not pure liquid chemical, the diptube may be attached to the inert gas source, allowing the inert gas to bubble through the liquid, saturating it with vapors of them chemical, which is then directed out of the reservoir and into a process chamber. Frequently, these types of process require heating of the reservoir to control the vapor pressure and consequent pickup of the chemical precursor. There may also be a need to temperature control the piping downstream of the reservoir to maintain the vapors or liquid in the proper state and prevent condensation or solidification, respectively.

All reservoirs must have a means for initially filling and cleaning the reservoir. In most cases, the reservoirs have a large cap (or "bung") that is screwed onto the top of the reservoir and sealed with elastomeric or metal o-rings and/or gaskets. This bung cap frequently has a flat surface that is used for the installation of level sense probes, including float, ultrasonic, differential pressure, thermal and other styles of immersible level senses. The bung cap has been used for this application for well over a decade, also.

There are special categories of reservoirs that are called variously "Ampoules", "Source Containers", "Hosts" and other proprietary names. These are typically small vessel, from 100 ml to 2 or 3 liters in size. These have essentially all of the features found in larger reservoirs and are mostly distinguished by size more than any other feature. They typically are mounted in process tools for use in delivering small amounts of chemical to the process tool under more controlled conditions then may be found in a refill system delivery setup. For instance, a bubbling application is usually performed right next to a process chamber to minimize the likelihood of condensation forming and causing process variability. In a DLI process, the exact flow rate may be limited by pressure, therefore requiring that inlet pressures be tightly controlled. Often these ampoules are kept in small temperature controlling units to maintain variables like vapor pressure, viscosity and precursor reactivity. However, from an apparatus point of view, the reservoir used for an "ampoule" application are essentially the same, except for size. Process ampoules have been used since the earliest years of the IC industry, and refillable ampoules in use since the middle of the 1980s. A suitably equipped reservoir can be used in any of the various applications defined for reservoirs including "bulk" (or replaceable) reservoirs, "process" (or fixed, rechargeable reservoirs), and "ampoules" (small fixed, rechargeable reservoirs)

Note that the simplest reservoir is the subset that consists of only a level sensor and a headspace valve. In this application, the reservoir headspace is exposed to a vacuum and the process precursor evaporates into the headspace and is then directed to the process chamber for use.

A special classification of vessel that is separate from the definition listed above is the "Recovery" or "Recycle" reservoir. This reservoir is designed for the purpose of capturing spent process cleaning solvent and spare process precursor, allowing it to be removed safely from a tool without disturbing the rest of the system. It's use is specialized in the solvent purge system, as it will permit the end user to return the spent chemical and solvent to the original factory; to port it to an scrubbed exhaust or to an external transportation vessel for disposal.

The recovery reservoir has a number of features that make it unique when compared to the other reservoirs discussed. First of all, it does not need to be a high purity vessel, since the materials inside may be spent solvent and a small percentage of leftover precursor. This material will be sent to a waste disposal facility at some point, but the materials inside will not be used for further wafer processing. Next, the vessel is designed for maximum capacity, as opposed to maximum strength. It is not expected to be used in an environment where it sees high internal pressures. As a result, it may be manufactured in a rectangular shape, rather than the more common cylindrical shape used for most of the other reservoirs. The general material of construction is stainless steel in order to maximize the capabilities of the reservoir, although other materials, as listed above, can suffice.

The reservoir we have designed uses two headspace ports, and may optionally include a diptube. In the standard setup, one headspace port is hooked up to the plumbing manifold wherein solvent and spent chemical reside. This port is the inlet and is used as the capture point for the spent solvents and precursors. The second port is used as a vent port to allow excess pressure that builds up during the solvent cleaning process. These ports are both attached to the system through the use of a valve, which can be manual or automatic in nature. Our implementation uses double-ended shut off quick disconnect valves. These valves are designed to snap into place easily, and when in place the valves are open. When the lines are disconnected for reservoir replacement, spring loaded valves on both sides of mating surface close, preventing significant chemical leakage. Note that standard manual or automatic valves can be used in the operation, but this adds complexity and cost by requiring additional steps and more expensive valves. Note that in this general configuration, the recovery reservoir is used as a trap.

In some cases, the present invention can have recovery reservoirs that contain diptubes on a third port. The purpose of the third port is to allow the transfer of spent solvent and precursor into another waste vessel, saving the facility from having to physically remove and replace the recovery reservoir. The diptube can also be used in conjunction with a vent port to evaporate the higher volatility solvents by bubbling an inert gas through the reservoir. The headspace port may also be used in conjunction with a vacuum source, such as a pump or a venturi generator, to evaporate excess solvent into a house scrubbed exhaust system.

In both cases, the container is continually vented through the headspace port, preventing excess pressure buildup. An additional port can be added to facilitate redundant backup to this, by installing it on the headspace and installing a pressure relief device. Both this port and the vent port should be installed using a checkvalve to prevent the possibility of backstreaming of exhaust air into the system.

The recovery reservoir will include level sense. All of the types of level sense already discussed may be used here. However, since the recovery vessel is not required to be a high purity vessel, float level senses are perfectly suitable for this design. Other types of internal level sense are acceptable including ultrasonic, thermal, capacitive, differential pressure, as well as external level sense such as load cells, external ultrasonic probes and the like.

The recovery vessel may be used in a number of different ways:

a—It can be used to collect only solvents and precursor residual, leaving behind material that may be considered "hazardous waste", i.e. it is flammable, toxic, corrosive or reactive b—It can be partially filled with an inert or non-hazardous material, such as water or dodecane or other long chain hydrocarbons or alcohols in order to dilute the process solvents and precursors to a non-hazardous range.

c—It can be partially filled with an absorbent material such as activated charcoal, in order to capture the excess solvent and precursor, also rendering the material safe and non-hazardous.

Each of these options is up to an end-user customer to define, and is based on their toxic waste strategies and local jurisdictions and rules.

The reservoirs are connected to each other and to the process tool through a manifold comprising a series of valves, pressure transducers, check valves, pressure regulators, and other components as required. These are installed in the area designated BULK Reservoir. Using an inert push gas such as helium, the system pushes the chemical into the fixed PROCESS Reservoir whenever the PROCESS Reservoir drops a configured percentage below the refill level. Fill continues until the PROCESS Reservoir reaches the settable refill level. Chemical is then continuously delivered to the process tool through the use of push gas pressure supplied through a separate regulator.

The process pressure of the system can be programmed from the setup page in the Remote or Local Operator Interface (RLOI, LOI). Once set, the outlet pressure in PROCESS Reservoir does not vary even if the BULK Reservoir is in Fill mode or being replaced.

A degasser may be installed in the present invention's cabinet to remove push gas from the process chemical.

The present invention is controlled with a microcomputer and a programmable operating system that monitors all key parameters and automatically controls most maintenance functions. For example, the SOLVENT PURGE and LEAK CHECK Operations are automated functions designed into the CHANGE RESERVOIR Operation. This automation improves consistency, reduces time and the effort involved in performing common system tasks. The present invention also provides zero downtime for normal operations as it permits the replacement of the BULK Reservoir while the PROCESS Reservoir is in process.

The patented SOLVENT PURGE operation is performed by a sequence wherein first, the process chemical in the lines ("pigtails") above the affected canister is pushed into the container, recovery container or abatement system, in accordance with the following preferred sequence:

a. Blow down chemical to recovery (approx. 20 min.);

b. Solvent flush;

c. Blow out solvent;

d. Solvent flush;

e. Blow out solvent;

f. Solvent cycles (solvent, blow out, vacuum);

g. Cycle purge (blow out, vacuum).

A vacuum is created in order to facilitate the scrubbing action of the solvent injection and to ensure the complete filling of the process line with solvent. The solvent is then removed and directed to a recovery vessel, and vacuum is applied again to remove residual traces of the solvent. The solvent used may vary as a function of process chemical. The requirements of the solvent used are that it completely dissolves the process chemical without reacting with it, can be completely evaporated by vacuum within a short period of time (typically within 1–5 minutes, depending on the solvent), leaves no residues, and meets the requirements of a non-hazardous byproduct after introduction to the recovery container. The recovery container may contain diluent to ensure that the solvent meets the non-hazardous byproduct requirement. This diluent may in turn react with the process chemical to form precipitates to further enhance the safety of the byproduct. The byproduct, thus treated may be returned to Schumacher for recycling and/or recovery of spent process chemical and/or solvent. Alternatively, this recovered solvent may be disposed of by the end-user customer.

The present invention is designed to ensure maximum purity of process chemicals used in normal operations.

The main system power supply is 90–250 VAC, auto-switched, for use in all countries.

The system is controlled by a computer for maximum flexibility in software upgrades and capabilities. Password protection prevents unauthorized personnel from attempting key tasks. Operating modes are displayed to simplify operation.

The Emergency Manual Off (EMO) circuit provides emergency shutdown, including standard red emergency OFF switch. This EMO circuit may be connected to other tools within the end-user facility to facilitate automated shut-down of multiple tools through the activation of a single EMO event. The EMO Switch also serves as the main power ON/OFF switch.

An automated CHANGE RESERVOIR procedure is installed, providing the users with the ability to change the chemical reservoir without contaminating the chemical or causing harm to the user or the environment.

The lines leading to the reservoir are designed with flexibility to help while installing the reservoir. Pressure relief is built in to prevent over pressurization of the reservoirs.

The present invention has been designed to meet or exceed industry environmental/safety regulations and specifications. The cabinet is steel, and includes integral spill containment. All power sources capable of providing shocks or sparks have been isolated and contained completely outside of the chemical cabinet.

Communication to the process tool is provided. The exact configuration required will depend greatly on the process tools in use.

The present invention will now be described with regard to a first embodiment. FIG. 1 shows a general plan view of a cabinet of the present invention with its front door removed to view the interior of the cabinet. The cabinet 10 has four side walls, a top wall and a floor. The door on the front side wall of the cabinet is not shown, nor is the color touch process control screen, mounted on the door, shown. The electronic control 22 of the cabinet is mounted on top of the cabinet and can be remotely accessed and controlled. A bulk process chemical container 12 is mounted on a shelf at the base of the cabinet, preferably on a scale for determining fluid content. The process chemical flows from the bulk container 12 to the process container 14 mounted on an intermediate shelf in the cabinet, also preferably on a scale. The process container is kept constantly at some minimal level of fill with process chemical to continually supply a remote semiconductor fabrication tool such as a chemical vapor deposition CVD tool, whereas the bulk container is allowed to go "dry" and be changed out while the process container 14 still has adequate chemical supply for demand. The flow of process chemical from the bulk container 12 to the process container 14 and subsequently to the point of use is managed by a manifold of process lines 20 shown in greater detail in FIG. 2. Additionally, solvent to clean the process lines is contained in solvent container 16, passes through the manifold 20 during the cleaning process, such as when the bulk container 12 is changed out or the process container 14 requires service or any time the process lines need to be opened to atmosphere. Used solvent containing residual process chemical remaining in the process lines is collected in the used solvent recovery container 18, which is preferably a generally rectangular container to maximize capacity and minimize space or footprint. This system allows for the management and dispensing of low volatility chemicals, which cannot readily be removed or cleaned from process lines merely with the application of vacuum and carrier gas, even with multiple cycles. The dispensing of chemical and the cleaning of process lines will be described in greater detail with reference to FIG. 2 below.

Figure 2:
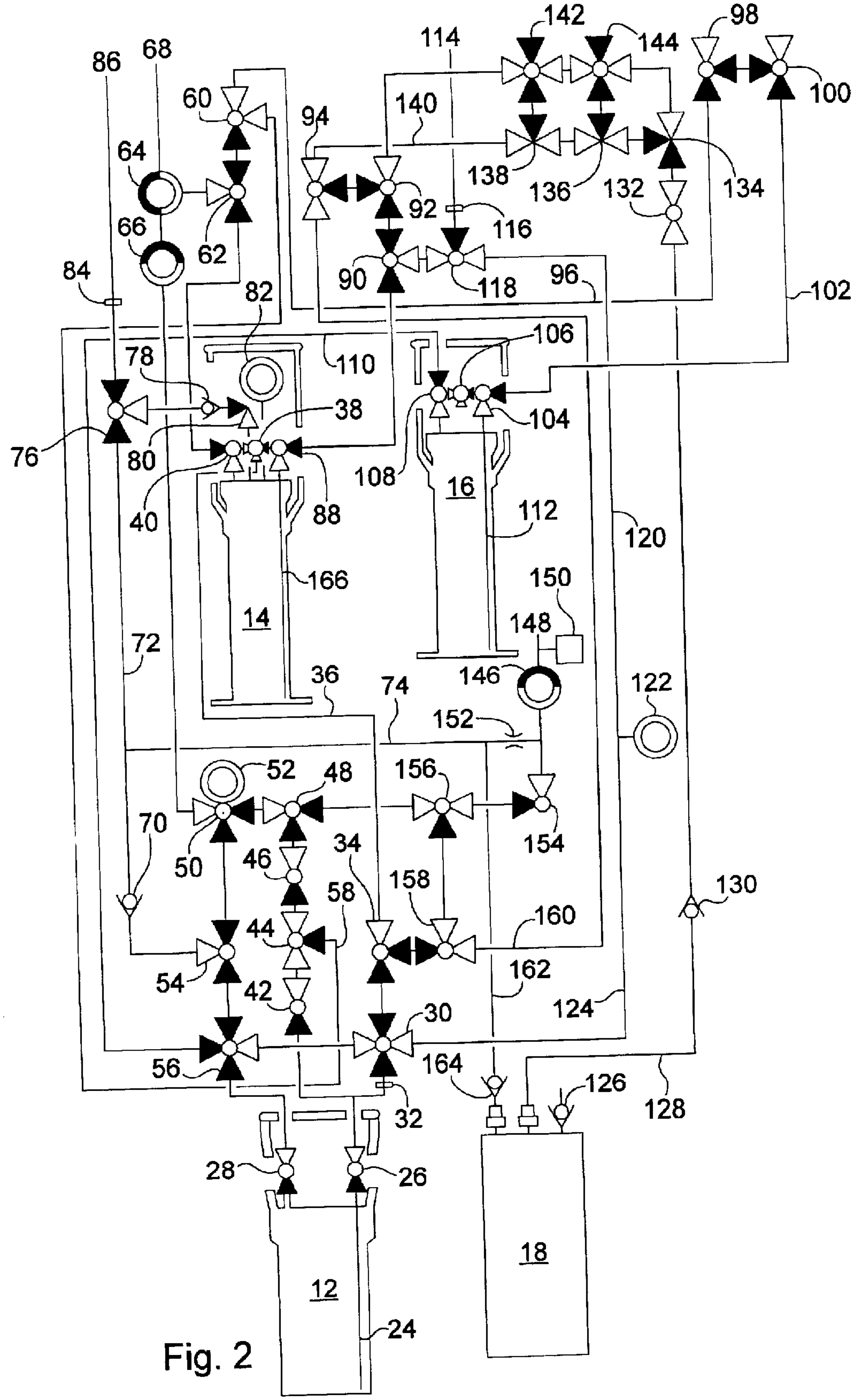
FIG. 2 is a schematic view of the containers, valves and process lines of the apparatus of the present invention.

With reference to FIG. 2, process chemical contained in bulk container s12 is removed through diptube 24 and container valve 26 by the action of pressurizing inert carrier gas applied through valves 28, 56, 54, 50, regulators 66 and 64 and pressurizing inert carrier gas source 68. Process chemical passes through ultrasonic liquid sensor 32, valves 30 and 34 and line 36 to valves 40 and 38, where the process chemical replenishes the process container 14. These components comprise the first manifold.

After or during replenishing, process container 14 has pressurizing inert push gas applied through valves 40 and 62, regulator 64 and push gas source 68. This gas, sometimes referred to as carrier or pressurizing gas, forces the process chemical in process container 14 to dispense through diptube 166, valves 88, 90, 92 and valves 142 and 144 depending on whether the process chemical is being delivered to one endpoint or multiple endpoints, such as CVD semiconductor fabrication tools, or quartz furnaces. These components comprise the second manifold.

When the bulk container 12 requires changeout, such as to replace an empty bulk container with a full bulk container, the system must have its process lines opened at the bulk container valves 26 and 28. Before this can be done, residual process chemical must be removed from the process lines for several reasons. Many process chemicals are toxic and should not be exposed to operators. Some process chemicals are sensitive to atmospheric exposure and could be pyrophoric or adversely react with components of the atmosphere to give contaminants, particulates or corrosives. These could contaminate or block the process lines or become entrained in the process chemical after re-startup. Therefore, it is important to thoroughly clean the lines prior to breaking the process lines for changeout. Traditionally, the industry merely subjected the process lines to cycles of vacuum and pressurizing gas. However for the low volatility chemicals mentioned above, such as TDMAT, such cycling is not sufficient. Therefore, for low volatility process chemicals, the present inventors have found that it is necessary to additionally use a solvent for the process chemical to clean the process lines prior to exposure to the atmosphere.

In the present invention, the process lines are first depressurized through valves 30, 34, 158, line 160, valve 94, line 140, valves 138, 136, 134 and 132, check valve 130, line 128, solvent recovery container 18, check valve 164, line 162, line 74, line 72, valve 76, ultrasonic sensor 84 and vent source 86. Subsequently to remove process chemical, purge gas is applied through nitrogen purge gas source 148, past pressure relief valve 150, pressure regulator 146, line 152, valves 154 and 156, valves 48, 46, 44, 42, and valve 26 (returning process chemical in the process lines to the bulk container 12), and also through ultrasonic sensor 32, valves 30, 34, 158, line 160, valve 94, line 140, valves 138, 136, 134, 132, check valve 130, line 128 and into solvent recovery container 18, check valve 164, line 162, line 74, line 72, valve 76, ultrasonic sensor 84 and vent source 86 (here container 18 is used to also contain process chemical from a portion of the process lines). Check valve 78 provides an alternate route for depressurization of process container 14 through valve 80. The process container 14 provides pressure indication through pressure gauge 82.

Similarly, after depressurizing and purging with pressurized gas, the lines are further cycled through exposure to the push gas source 68, including through valves 50, 54, 56, 48, 46, 44 and 42. Push gas can be monitored by pressure gauge 52. Multiple administrations of venting, vacuum and push gas referred to as cycles can be conducted to remove residual process chemical from the process lines to the extent possible. However, to remove process chemicals to acceptable levels in acceptable time periods, the use of solvent is necessary for the low volatility process chemicals.

Solvent can be directed to various areas of the manifold 20 depending upon which process lines need to be opened or "broken", for instance when the bulk container is to be changed out, the process container is to be serviced or some portion of the process lines need service. Solvent is contained in solvent container 16. The solvent is dispensed in the same manner that process chemical is removed from the process container or from the bulk container. Push gas, comprising a pressurized inert gas, is introduced from push gas source 68 through regulators 64 and 66, valves 50, 54 and 56 and then through line 110 connecting to valve 108. The push gas pressurizes the headspace of the solvent container 16, forcing solvent up and out of diptube 112.

To clean the process lines emanating from the bulk container 12, solvent is sent from solvent container 16, out diptube 112, valve 104, past the face of closed cross-over valve 106, through line 102, valves 100 and 98, line 96, valve 60, line 58, valves 44, 42, 30, 34, and 158, line 160, valve 94, line 140, valves 138, 136, 134, 132, check valve 130 and line 128 to solvent recovery container 18. Solvent container can be vented through check valve 126. During this process, the solvent removes low vapor pressure process chemical from the lines and valves that it passes through. After further cycles of venting, push gas and vacuum, the bulk container can be decoupled from the system at valves 26 and 28 without concern that any process chemical will be released to atmosphere or atmospheric components will react with low vapor pressure process chemical which otherwise could have remained in the process lines.

The use of solvent reduces the time required to clean the process lines for disconnection by a significant amount. Depending on the process chemical, non-solvent assisted clean out could take days/hours. With solvent assist, clean out can be reduced to a few hours/minutes, respectively. This quick changeout timing provides considerable advantage to the user, because of the high expense of keeping any semiconductor chip manufacturing tool out of production given their capital cost and the value of the semiconductor chips that could otherwise be produced.

Solvent is not used to clean out the left hand side of the manifold of the bulk container 12, comprising valves 28, 56, 54 and the lines coming form the vent source 86, including check valve 70, and the push gas source 68. Therefore, solvent is not run through the crossover line between valves 30 and 56. Solvent is not necessary to clean out the left side of the bulk containers attendant manifold, because the low volatility process chemical is not exposed to that portion of the manifold. Therefore, solvent is not introduced into the crossover line between valves 30 and 56.

Solvent can also be used to clean the lines from the process container 14. As described above, solvent can be supplied to valve 60 from the solvent container 16. From valve 60, the solvent passes through valve 62 to valve 40, valve 38, valves 88, 90, 92, 142, 144, 134, 132 and line 128 (past check valve 130) before being stored as spent or used solvent in solvent recovery container 18.

Vacuum is delivered to either or both the process container 14 or the bulk container 12 during the cleaning cycle from vacuum source 114, ultrasonic liquid sensor 116, valves 118, 90, and 88, or line 120 (past pressure gauge 122) and line 124 and valve 30 for the bulk container 12.

Solvent can also be supplied to the downstream semiconductor fabrication tool (not shown) through solvent outlets associated with valves 98 and 100. The solvent can be returned to solvent recovery container 18 through the process chemical outlets associated with valves 142 and 144 and solvent return line 128, or through an optional external line that connects to the line between valve 132 and check valve 130.

Another important aspect of the apparatus of the present invention is the geometry of the valves that become wetted with the low volatility process chemical. To avoid areas where the chemical would be especially hard to remove, known as deadspace, process chemical wetted valves are designed as diaphragm valves. The diaphragm is a thin flexible metal membrane in meniscus cross-sectional shape having a concave side and a convex side. This membrane operates against a valve seat to provide the valving function.

Figure 3:
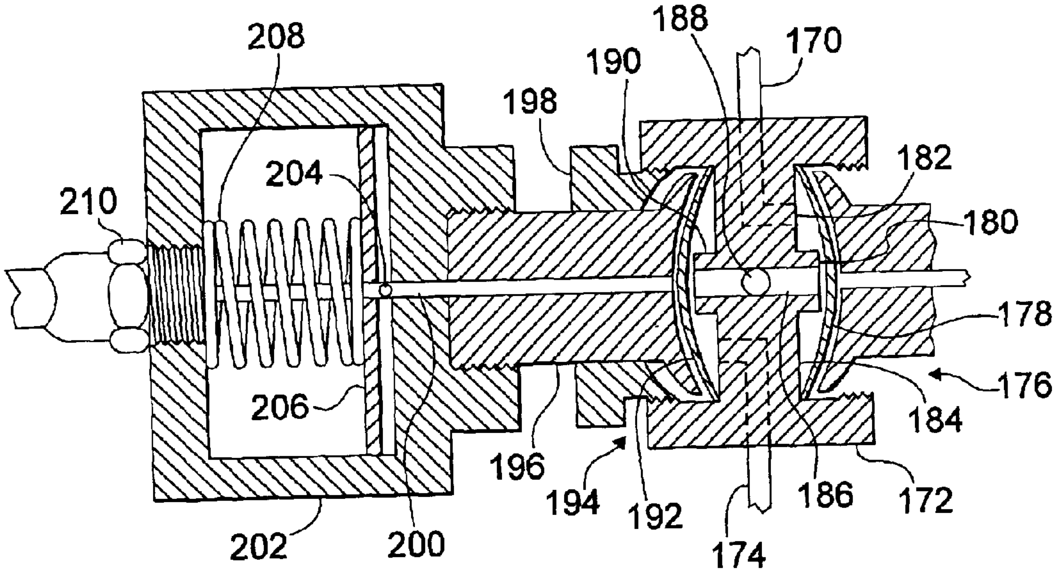
FIG. 3 is a cross-sectional view of a diaphragm valve of the present invention.

The diaphragm valves are best illustrated in FIG. 3. FIG. 3 shows a multiport valve, wherein one of the diaphragm valves is shown with its pneumatic actuator. Valve 194 has a diaphragm 192 whose concave side engages valve seat 190 to control flow from the central port 188 and axial channel 186 to outlet 174. The diaphragm 192 is held in place in the valve seat 172 by coupler 198, which retains the axial member 196. An axial control rod 200 passes through member 196 and can engage the diaphragm 192 to open or close it based upon pneumatic actuation from the pneumatic housing 202 comprising pneumatic pressure from pneumatic line 210 and aperture 204 acting upon baffle 206 which counteracts spring 208. The spring 208 keeps the diaphragm 192 sealed against the seat 190 until pneumatic pressure overcomes the spring 208 and backs the diaphragm 192 off the valve seat 190 allowing process chemical to flow through the valve 194.

The readily cleaned side of the diaphragm valve 194 is the valve seat 190 side, as opposed to the downstream side represented by line 174. This is because the valve seat or "clean side" minimizes surface area and deadspaces.

A tandem diaphragm valve 176 is shown adjoining valve 194. Valve 176 has diaphragm 178, which engages valve seat 180 to control flow between channel 186/aperture 188 and process line 170, which terminates in the diaphragm valve 176 at aperture 182. The area, which may be susceptible to deadspace difficulties, is 184 under the diaphragm's concave surface and downstream of the valve seat 180. Other portions of valve 176 are not illustrated, but are similar to valve 194.

The diaphragm valve 194 structure is used in the process chemical wetted valves of the overall apparatus to facilitate rapid and thorough cleanup by minimizing deadspace where process chemical might hang up. For instance, valve 92 is a diaphragm valve with its clean side directed towards the second manifold. This facilitates cleaning when the process lines are to be disconnected to perform a maintenance function on the second manifold.

An additional feature of the present invention is the use of trickle purge using nitrogen from trickle purge source 148, relief valve 150, pressure regulator 146, valve 154 and valve 156 which distributes the trickle purge to various portions of the system to avoid build up of chemical in any particular part of the system where it is unintended. The trickle purge can also be connected to vent through line 74 and orifice 152.

Solvent can be removed or separated from the process chemical in the solvent recovery container 18 by separating the solvent from the process chemical by evaporating the solvent from the process chemical, such evaporation effected by a step selected from the group consisting of an entraining gas passed through the solvent, the application of heat to the solvent, the application of vacuum to the solvent and combinations thereof.

The present invention provides for a delivery method and apparatus to effectively deliver low vapor pressure process chemicals which method and apparatus are readily cleaned by a combination of venting, push gas, vacuum, solvent and the use of diaphragm valves where surfaces will become process chemical wetted. This provides for significant reductions in the downtime when the process lines are open to atmosphere such as in bulk container changeout or other maintenance. Downtime reductions from days/hours to several hours/minutes, respectively, can be accomplished with the present invention.

The present invention has been set forth with regard to one or more preferred embodiments, but the full scope of the present invention should be ascertained from the claims, which follow.

What is claimed is:

1. An apparatus for storing and delivering a low vapor pressure process chemical to a process tool for semiconductor fabrication, comprising:

a) a bulk container for storing said low vapor pressure process chemical;

b) a process container for delivering said low vapor pressure process chemical to said process tool;

c) a first manifold for resupplying said low vapor pressure process chemical from said bulk container to said process container through one or more diaphragm valves having the valve seat side of the valve directed to the portion of the manifold which can be disconnected from the bulk container;

d) a solvent container containing a quantity of solvent for the low vapor pressure process chemical and connected in fluid flow with said first manifold;

e) a second manifold for delivering said low vapor pressure process chemical from said process container to said process tool through one or more diaphragm valves having the valve seat side of the valve directed to the portion of the manifold which can be disconnected from the first manifold;

f) a source of vacuum;

g) a source of pressurized inert gas;

h) a controller for controlling the flow of process chemical from said bulk container and from said process container and the flow of solvent from said solvent container and for cycling the first and second manifolds through a cleaning cycle of a series of applications of vacuum, pressurizing gas and solvent to clean said manifolds.

2. The apparatus of claim 1 wherein said first and second manifolds are connected and are further connected to a source of venting.

3. The apparatus of claim 2 wherein a container selected from the group consisting of the bulk container, the process container or both has a baffle on the source selected from the group consisting of the source of vacuum, the source of venting or both with a baffle selected from the group consisting of right angled tubing, a "tee" fitting, screen/mesh assembly, filter, or combinations thereof.

4. The apparatus of claim 1 wherein solvent lines are connected to said solvent container and the process tool to flow solvent to the process tool.

5. The apparatus of claim 4 wherein said flow of solvent to said process tool is returned in the second manifold.

6. The apparatus of claim 1 wherein a solvent recovery container is connected to said first and second manifolds to recover solvent flowing through said manifolds from said solvent container.

7. The apparatus of claim 1 wherein said solvent container is connected in fluid flow with said second manifold.

8. The apparatus of claim 1 wherein said first manifold has an ultrasonic liquid sensor to detect any solvent in said manifold.

9. The apparatus of claim 1 wherein said first manifold has an ultrasonic liquid sensor to determine when the bulk container is empty.

10. The apparatus of claim 1 wherein said first manifold has a source of trickle purge of inert gas to avoid atmospheric exposure of said process chemical and said manifold.

11. The apparatus of claim 1 wherein said low vapor pressure process chemical is selected from the group consisting of tetradimethylaminotitanium (TDMAT), tetradiethylaminotitanium (TDEAT), tantalum pentaethoxide (TAETO), $TiCl_4$, copper perfiuoroacetylacetonate-trimethylvinylsilane and mixtures thereof.

12. A process of storing and delivering a low vapor pressure process chemical to a process tool for semiconductor fabrication, comprising:

a) providing a quantity of said low vapor pressure process chemical in a bulk container;

b) periodically delivering said low vapor pressure process chemical to a process container from said bulk container through a first manifold having one or more diaphragm valves having the valve seat side of the valve directed to the portion of the manifold which can be disconnected from the bulk container;

c) periodically delivering said low vapor pressure process chemical to a process tool from said process container through a second manifold having one or more diaphragm valves having the valve seat side of the valve directed to the portion of the manifold which can be disconnected from the process container;

d) providing a quantity of solvent for said low vapor pressure process chemical in a solvent container;

e) periodically delivering said solvent to said first or second manifold when said low vapor pressure process chemical is not being delivered to said first or second manifold to remove said low vapor pressure process chemical from said manifold and storing it in a solvent recovery container.

13. The process of claim 12 wherein a sequence of vacuum and pressurizing gas are applied to said first manifold prior to delivering said solvent to said first manifold.

14. The process of claim 11 wherein a sequence of vacuum and pressurizing gas are applied to said second manifold prior to delivering said solvent to second manifold.

15. The process of claim 13 wherein the first manifold is vented prior to the sequence of vacuum and pressurizing gas.

16. The process of claim 14 wherein the second manifold is vented prior to the sequence of vacuum and pressurizing gas.

17. The process of claim 13 wherein said pressurizing gas provides the force for delivering said low vapor pressure process chemical to said process container from said bulk container through said first manifold by contacting said pressurizing gas with an inlet valve of said bulk container and wherein said solvent does not contact said inlet valve.

18. The process of claim 12 wherein process chemical is detected in said first manifold by an ultrasonic liquid sensor.

19. The process of claim 12 wherein said first manifold has a source of trickle purge of inert gas flowing through it to avoid atmospheric exposure of said process chemical and said manifold.

20. The process of claim 12 wherein said low vapor pressure process chemical is selected from the group consisting of tetradimethylaminotitanium (TDMAT), tetradiethylaminotitanium (TDEAT), tantalum pentaethoxide (TAETO), $TiCl_4$, copper perfluoroacetylacetonate-trimethylvinylsilane and mixtures thereof.

21. A process of storing and delivering a low vapor pressure process chemical to a process tool for semiconductor fabrication, comprising:

a) providing a quantity of said low vapor pressure process chemical in a bulk container;

b) periodically delivering said low vapor pressure process chemical to a process container from said bulk container through a first manifold having one or more diaphragm valves having a valve seat side of said valve directed to the portion of said first manifold which can be disconnected from the bulk container;

c) periodically delivering said low vapor pressure process chemical to a process tool from said process container through a second manifold having one or more diaphragm valves having the valve seat side of the valve directed to the portion of the manifold which can be disconnected from the process container;

d) removing residual process chemical from said first manifold to a solvent recovery container by at least one application of a pressurizing gas to said first manifold;

e) providing a sequence of vacuum and pressurizing gas to said first manifold;

f) providing a quantity of solvent for said low vapor pressure process chemical in a solvent container;

g) periodically delivenng said solvent to said first manifold when said low vapor pressure process chemical is not being delivered to said first manifold to remove said low vapor pressure process chemical from said manifold and storing it in said solvent recovery container;

g) disconnecting said bulk container from said first manifold and replacing it with another bulk container containing said low vapor pressure process chemical.

* * * * *